US011348799B2

(12) United States Patent
Her et al.

(10) Patent No.: US 11,348,799 B2
(45) Date of Patent: May 31, 2022

(54) METHOD OF MANUFACTURING MOLD FOR DIFFRACTION GRATING LIGHT GUIDE PLATE AND METHOD OF MANUFACTURING DIFFRACTION GRATING LIGHT GUIDE PLATE

(71) Applicant: LG CHEM, LTD., Seoul (KR)

(72) Inventors: Eun Kyu Her, Daejeon (KR); Song Ho Jang, Daejeon (KR); Chung Wan Kim, Daejeon (KR); Bu Gon Shin, Daejeon (KR); Jeong Ho Park, Daejeon (KR); Jung Hwan Yoon, Daejeon (KR); So Young Choo, Daejeon (KR)

(73) Assignee: LG CHEM, LTD, Seoul (KR)

( * ) Notice: Subject to any disclaimer, the term of this patent is extended or adjusted under 35 U.S.C. 154(b) by 0 days.

(21) Appl. No.: 16/958,602

(22) PCT Filed: Jun. 18, 2019

(86) PCT No.: PCT/KR2019/007323
§ 371 (c)(1),
(2) Date: Jun. 26, 2020

(87) PCT Pub. No.: WO2019/245257
PCT Pub. Date: Dec. 26, 2019

(65) Prior Publication Data
US 2020/0335347 A1 Oct. 22, 2020

(30) Foreign Application Priority Data
Jun. 20, 2018 (KR) .................. 10-2018-0070583

(51) Int. Cl.
H01J 37/32 (2006.01)
H01L 21/3065 (2006.01)
F21V 8/00 (2006.01)

(52) U.S. Cl.
CPC ........ *H01L 21/3065* (2013.01); *G02B 6/0065* (2013.01); *H01J 37/32422* (2013.01); *H01J 37/32651* (2013.01)

(58) Field of Classification Search
CPC ........ B29C 2033/3871; B29C 33/3857; B29D 11/00; G02B 6/0065; H01J 37/32422; H01J 37/32651; H01L 21/3065
USPC ........ 438/689, 706, 712, 713, 714, 717, 723
See application file for complete search history.

(56) References Cited

U.S. PATENT DOCUMENTS

| 4,309,267 A | 1/1982 | Boyd et al. |
| 6,379,573 B1 | 4/2002 | Kim et al. |
| 6,437,513 B1 * | 8/2002 | Stelzer .................. G01T 1/29 |
| | | 315/111.81 |
| 9,659,797 B1 | 5/2017 | Burckel et al. |

(Continued)

FOREIGN PATENT DOCUMENTS

| CN | 1638088 A | 7/2005 |
| CN | 102693943 A | 9/2012 |

(Continued)

*Primary Examiner* — Lan Vinh
(74) *Attorney, Agent, or Firm* — Dentons US LLP

(57) ABSTRACT

The present invention relates to a method of manufacturing a mold for a diffraction grating light guide plate by using two mask films, the mold having first to fourth pattern portions provided on one surface thereof, and to a method of manufacturing a diffraction grating light guide plate.

12 Claims, 8 Drawing Sheets

(56) References Cited

U.S. PATENT DOCUMENTS

| | | |
|---|---|---|
| 2006/0219887 A1 | 10/2006 | Hwang et al. |
| 2010/0096088 A1 | 4/2010 | Okita et al. |
| 2010/0167186 A1* | 7/2010 | Jang .................. G03F 1/24 430/5 |
| 2010/0239783 A1* | 9/2010 | Mao ................ C23C 16/401 427/578 |
| 2012/0009512 A1* | 1/2012 | Jang .................. B82Y 40/00 430/5 |
| 2015/0299534 A1* | 10/2015 | Yoshioka ............. B32B 27/16 156/712 |
| 2016/0027623 A1* | 1/2016 | Ishihara .............. C23C 14/352 204/298.07 |

FOREIGN PATENT DOCUMENTS

| | | |
|---|---|---|
| JP | 2008004711 A | 1/2008 |
| JP | 2010-141338 A | 6/2010 |
| JP | 2011018870 A | 1/2011 |
| KR | 10-0281241 B1 | 11/2000 |
| KR | 10-2000-0033006 B1 | 6/2001 |
| KR | 10-2013-0007984 A | 1/2013 |
| KR | 10-1509529 B1 | 4/2015 |
| KR | 10-1532756 A | 6/2015 |
| KR | 10-2016-0063920 A | 6/2016 |
| KR | 10-2016-0130799 A | 11/2016 |
| KR | 10-2017-0073218 A | 6/2017 |

* cited by examiner

[Figure 1A]
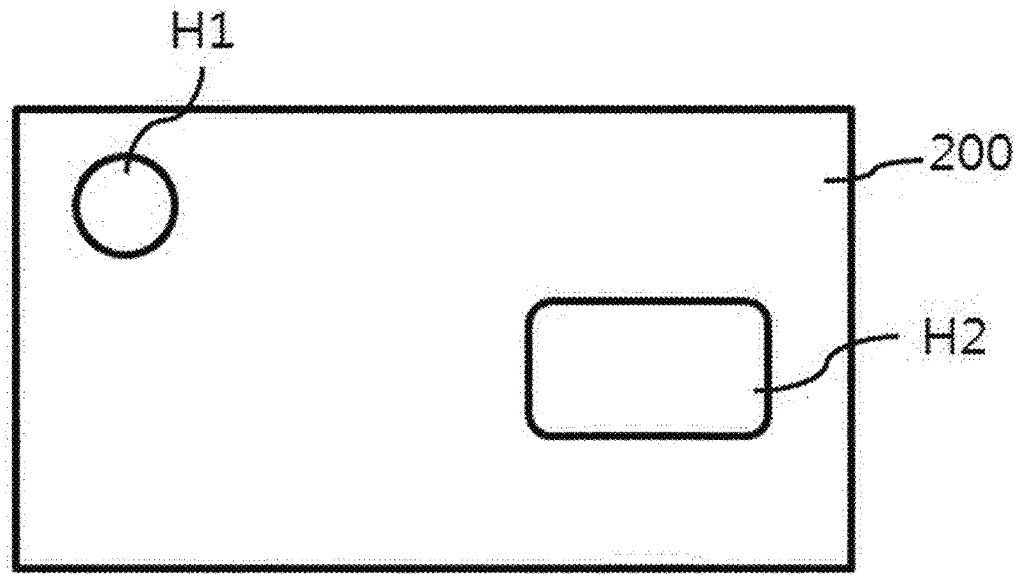
[Figure 1B]
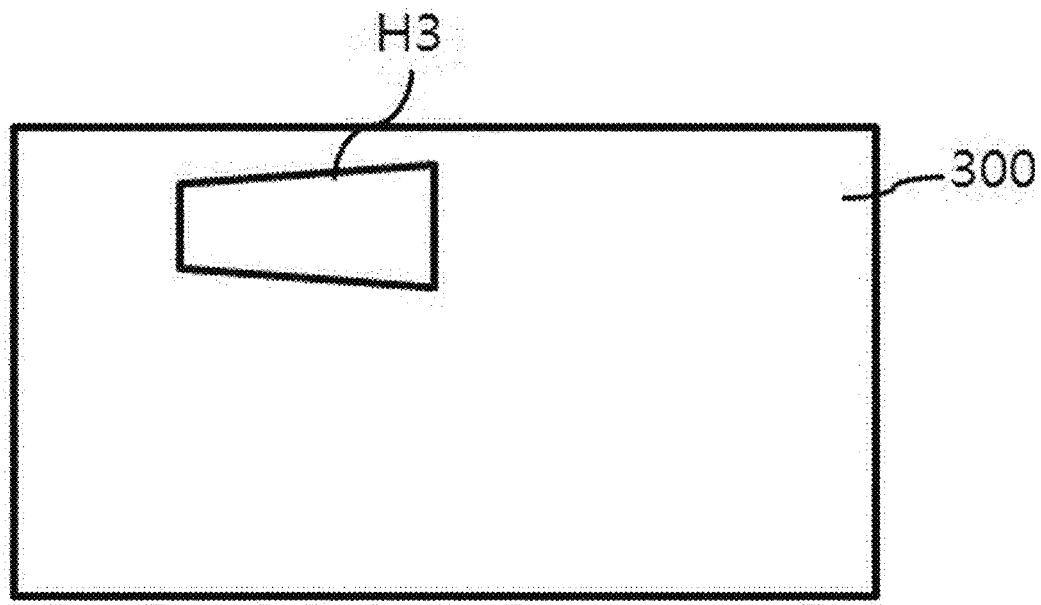

[Figure 1C]
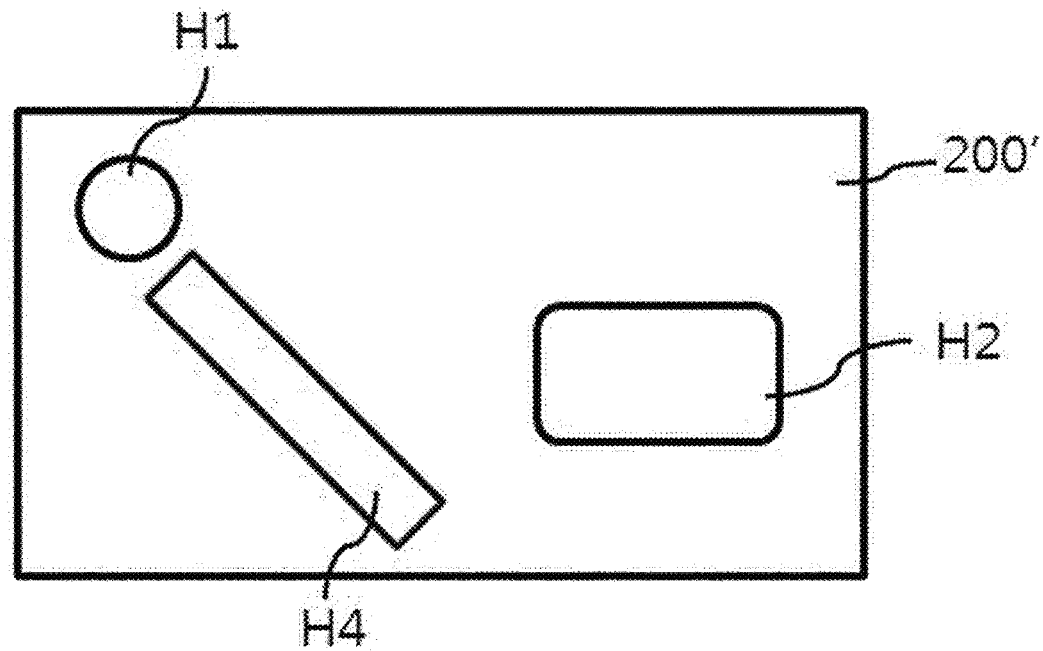
[Figure 2A]
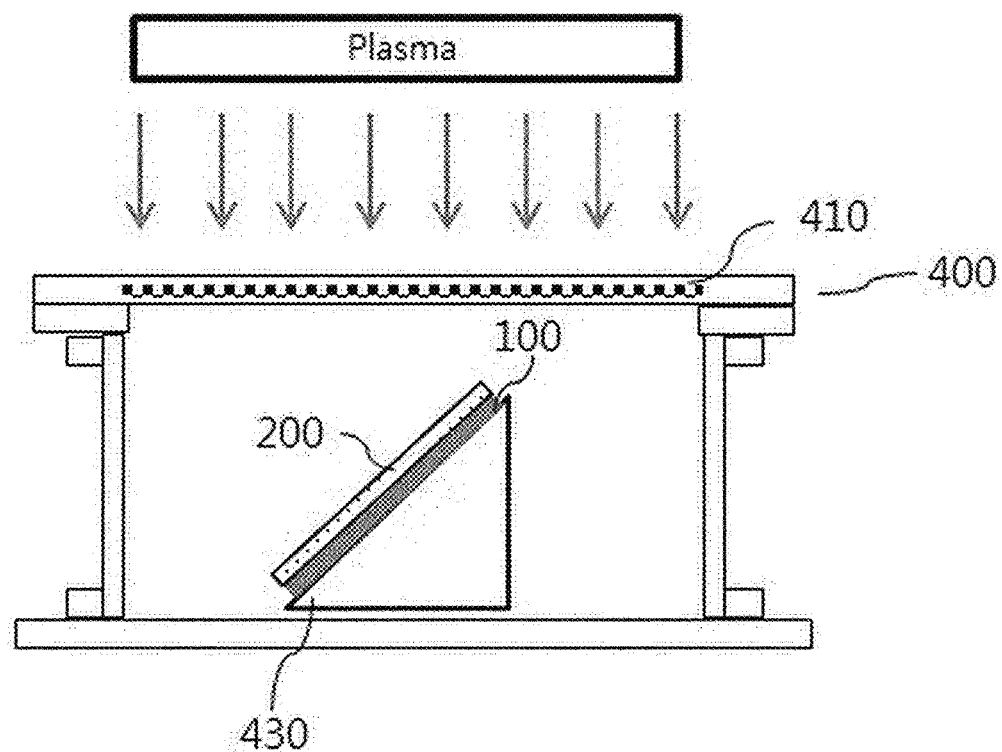

[Figure 2B]
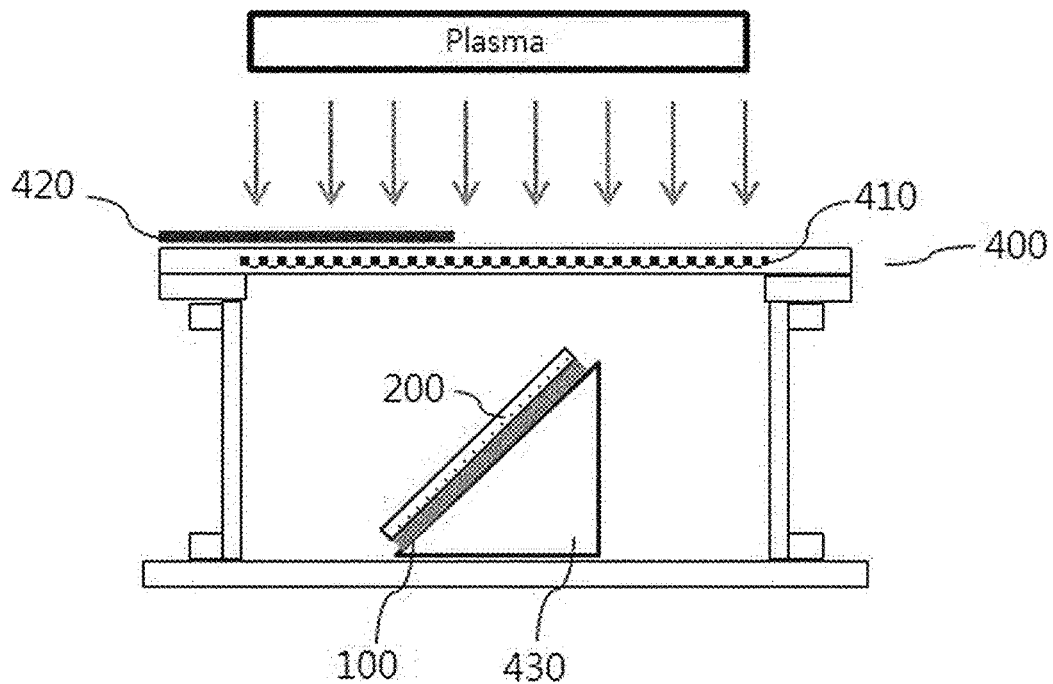
[Figure 2C]
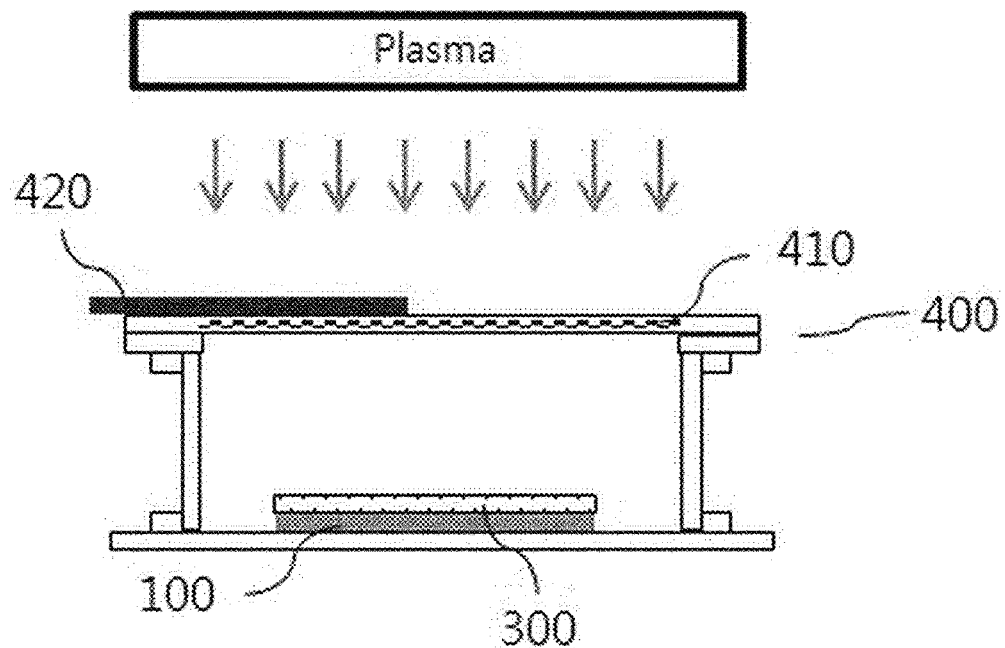

[Figure 2D]
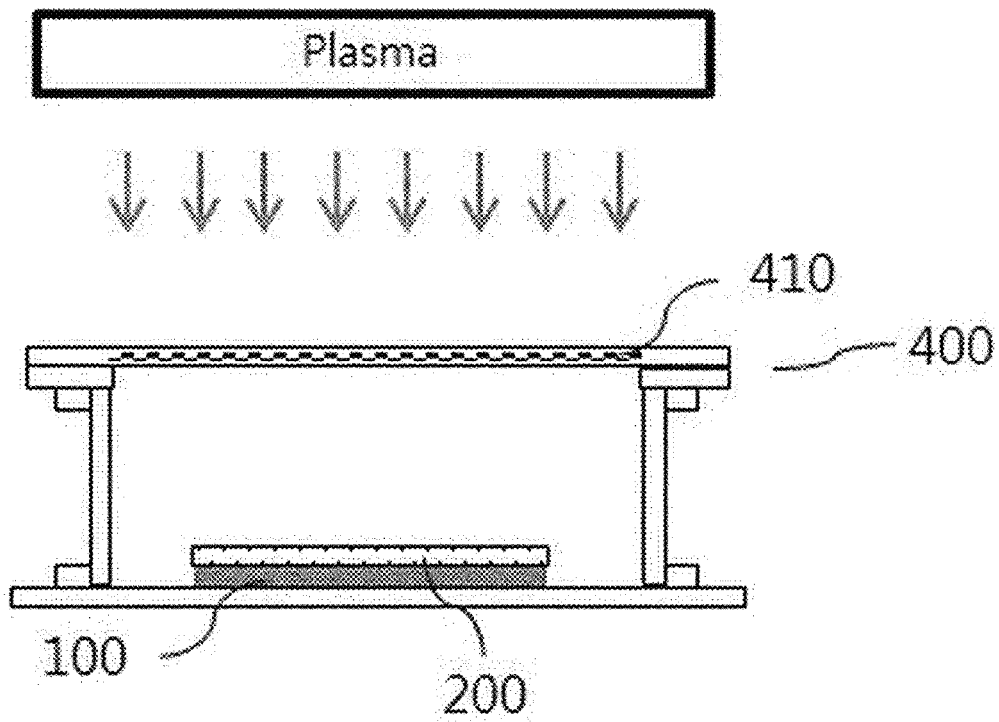
[Figure 3]
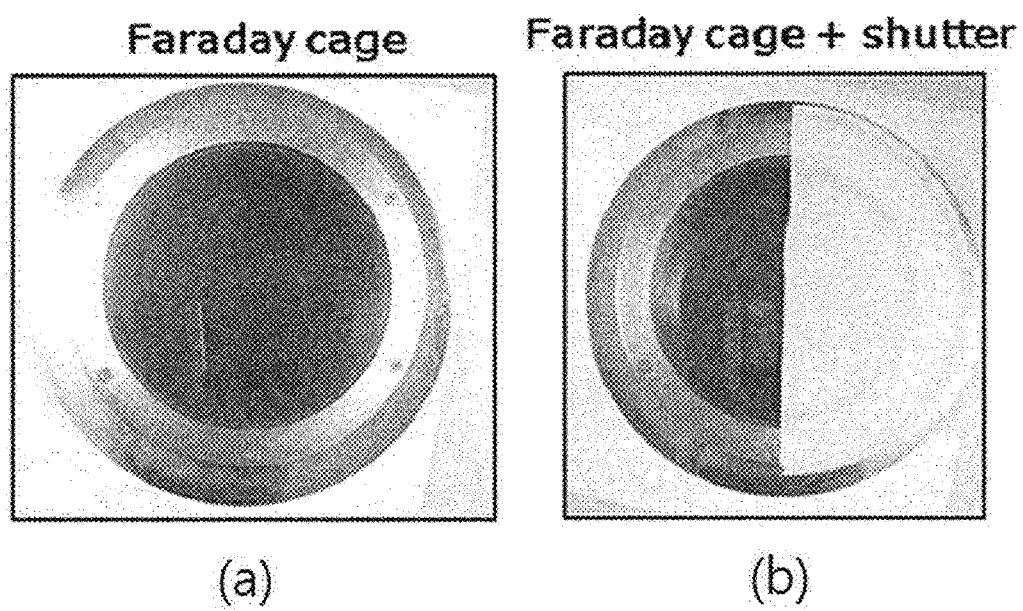
(a)          (b)

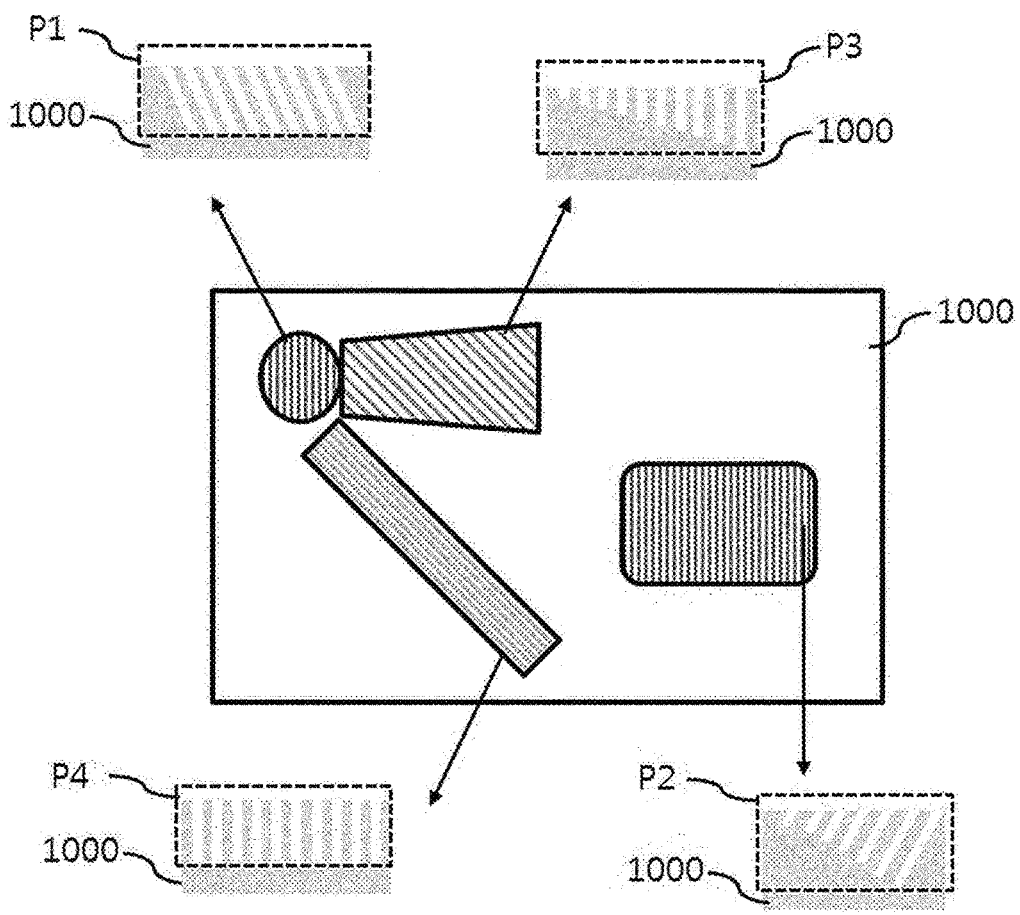
[Figure 4]

[Figure 5]
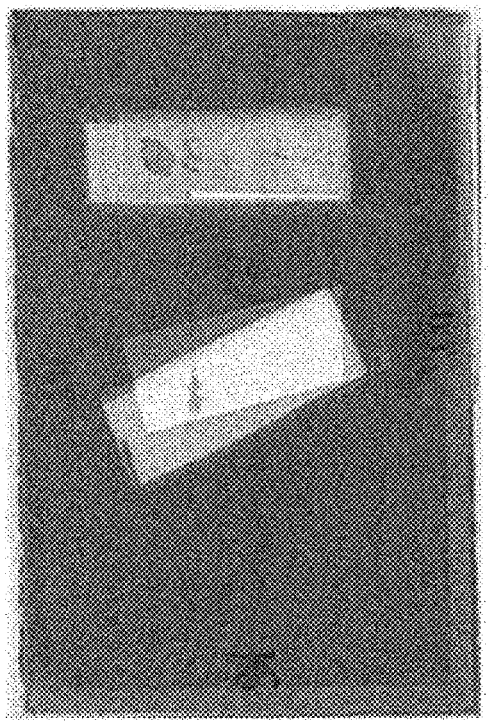 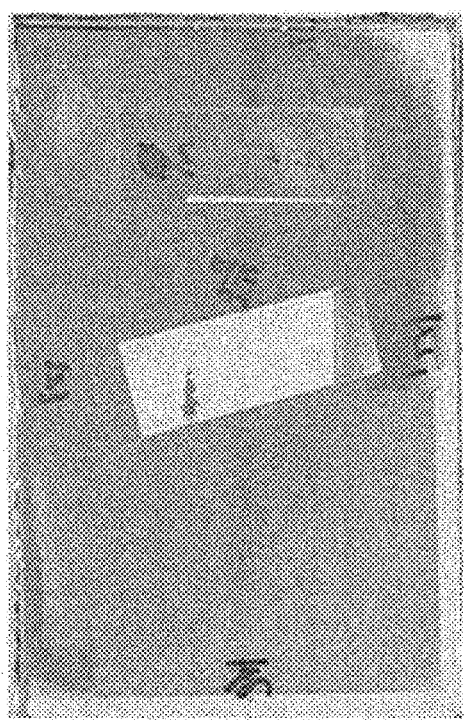
(a)                  (b)

[Figure 6]
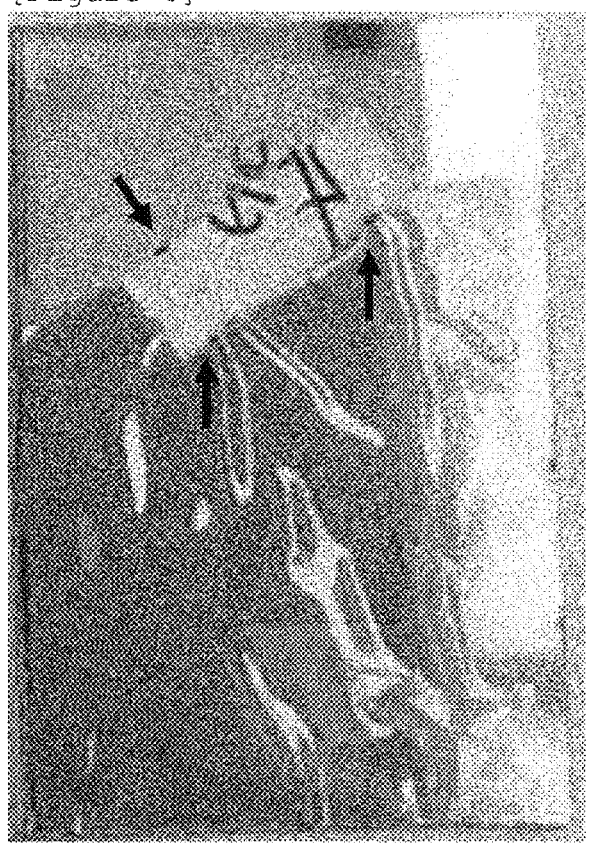

[Figure 7]
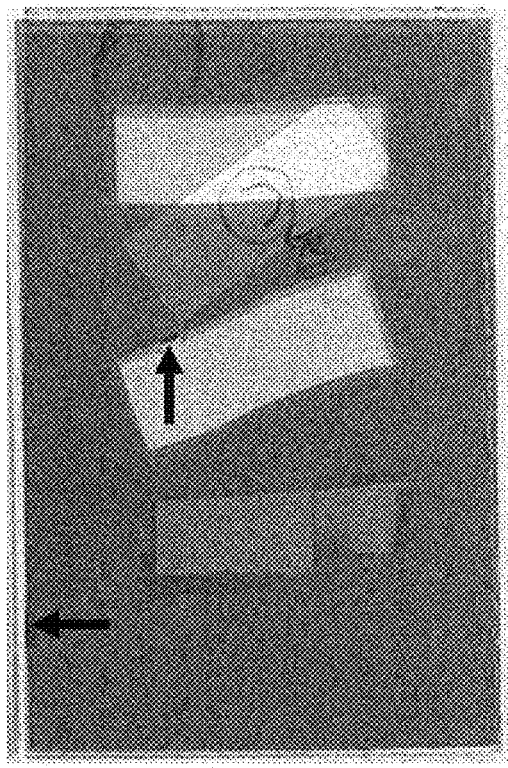 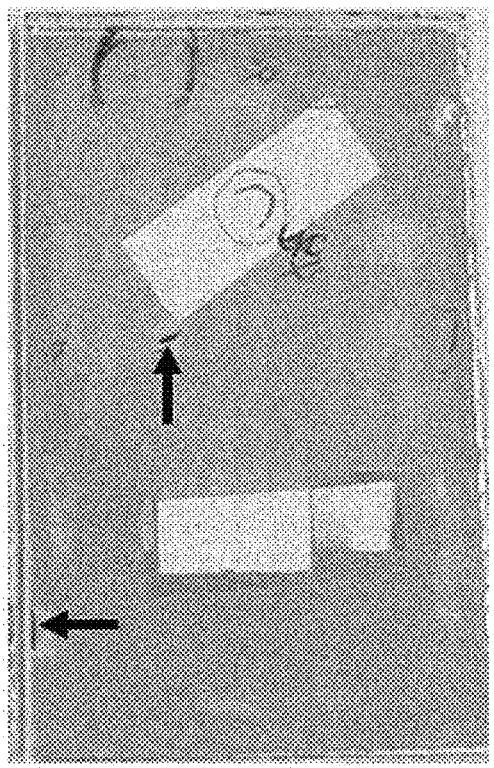
(a)                      (b)

METHOD OF MANUFACTURING MOLD FOR DIFFRACTION GRATING LIGHT GUIDE PLATE AND METHOD OF MANUFACTURING DIFFRACTION GRATING LIGHT GUIDE PLATE

The present application is a National Phase entry pursuant to 35 U.S.C. § 371 of International Application No. PCT/KR2019/007323 filed Jun. 18, 2019, and claims priority to and the benefit of Korean Patent Application No. 10-2018-0070583 filed with the Korean Intellectual Property Office on Jun. 20, 2018, the entire contents of which are incorporated herein by reference.

FIELD

The present invention relates to a method of efficiently manufacturing a mold for a diffraction grating light guide plate, and a method of manufacturing a diffraction grating light guide plate.

BACKGROUND

Recently, as interest in a display unit for implementing augmented reality (AR), mixed reality (MR), and virtual reality (VR) has increased, the display unit has been actively researched. The display unit for implementing augmented reality, mixed reality, or virtual reality includes a diffraction grating light guide plate that uses diffraction based on wave characteristics of light. The diffraction grating light guide plate includes diffraction grating patterns that may internally reflect, or totally and internally reflect, incident light to guide the light entering the diffraction grating light guide plate to one point.

The diffraction grating light guide plate includes a first region where light enters, and a second region where the light having entered the diffraction grating light guide plate exits. The first and second regions are each provided with diffraction grating patterns. Furthermore, a diffraction grating light guide plate has been developed, which includes a third region that guides the light from the first region to the second region, and a fourth region that may more effectively guide the light from the third region to the second region. In this case, the third region and the fourth region are each provided with diffraction grating patterns.

Various methods are used to manufacture the diffraction grating light guide plate. In general, the diffraction grating light guide plate is manufactured by an imprinting method using a mold. A mask etching process may be used to manufacture a mold for a diffraction grating light guide plate. In this case, a mold base, which is used to manufacture a diffraction grating light guide plate provided with desired diffraction grating patterns, is provided with diffraction grating patterns different in shape from one another. However, different mask etching conditions are used to form the diffraction grating patterns different in shape from one another, and for this reason, there is a problem in that mask films need to be changed each time each the diffraction grating patterns are formed.

In addition, there is a problem in that the mold base is damaged if the mask film provided on the mold base is thermally deformed or sufficient attachment force is not applied between the mask film and the mold base during the mask etching process.

Accordingly, there is a need for a technology capable of effectively forming diffraction grating patterns on a mold base.

SUMMARY

The present invention has been made in an effort to provide a method of efficiently manufacturing a mold for a diffraction grating light guide plate and a method of manufacturing a diffraction grating light guide plate.

However, technical problems to be solved by the present invention are not limited to the above-mentioned technical problems, and other technical problems, which are not mentioned above, may be clearly understood by those skilled in the art from the following descriptions.

An exemplary embodiment of the present invention provides a method of manufacturing a mold for a diffraction grating light guide plate, the method including: preparing a first mask film including first and second openings each formed in an independent region, respectively; attaching the first mask film to one surface of a molding base, opening only the first opening, positioning the molding base with the first mask film attached thereto in a Faraday cage having a mesh part provided on an upper surface thereof, and then forming, by using plasma etching, a first pattern portion in a first region of one surface of the molding base which is exposed through the first opening; and opening only the second opening, and then forming, by using plasma etching, a second pattern portion in a second region of one surface of the molding base which is exposed through the second opening, wherein the first mask film includes a first base and a first adhesive layer provided on one surface of the first base, a glass transition temperature of the first base is 70° C. or more and 100° C. or less, and adhesive force of the first adhesive layer is 30 gf/in or more and 50 gf/in or less.

Another exemplary embodiment of the present invention provides a method of manufacturing a diffraction grating light guide plate, the method including: preparing a mold for a diffraction grating light guide plate manufactured by the method of manufacturing a mold for a diffraction grating light guide plate; applying a resin composition onto one surface of the mold for a diffraction grating light guide plate, the surface having pattern portions thereon; and curing the resin composition.

The method of manufacturing a mold for a diffraction grating light guide plate according to the exemplary embodiment of the present invention may efficiently manufacture the mold for a diffraction grating light guide plate, the mold including various types of pattern portions provided on one surface thereof.

The effects of the present invention are not limited to the above-mentioned effects, and other effects, which are not mentioned above, may be clearly understood by those skilled in the art from the present specification and the accompanying drawings.

BRIEF DESCRIPTION OF DRAWINGS

FIG. 1A is a view illustrating a first mask film having first and second openings according to an exemplary embodiment of the present invention, FIG. 1B is a view illustrating a second mask film having a third opening, and FIG. 1C is a view illustrating the first mask film having the first opening, the second opening, and a fourth opening.

FIG. 2A is a view illustrating a step of forming a first pattern portion according to the exemplary embodiment of the present invention, FIG. 2B is a view illustrating a step of forming a second pattern portion, FIG. 2C is a view illustrating a step of forming a third pattern portion, and FIG. 2D is a view illustrating a step of forming a fourth pattern portion.

FIGS. 3(a) and 3(b) are photographs of a Faraday cage according to an exemplary embodiment of the present invention.

FIG. 4 is a view illustrating one surface of a mold for a diffraction grating light guide plate, the mold manufactured by a method of manufacturing a mold for a diffraction grating light guide plate according to the exemplary embodiment of the present invention.

FIGS. 5(a) and 5(b) are photographs of a mask film manufactured in Example 1 of the present invention after plasma etching.

FIG. 6 is a photograph of a mask film manufactured in Comparative Example 3 after plasma etching.

FIGS. 7(a) and 7(b) are photographs of a mask film manufactured in Comparative Example 5 after plasma etching.

DETAILED DESCRIPTION

Throughout the specification of the present application, unless explicitly described to the contrary, the word "comprise/include" and variations such as "comprises/includes" or "comprising/including" will be understood to imply the further inclusion of stated elements, not the exclusion of any other elements.

Throughout the specification of the present application, when one member is disposed "on" another member, this includes not only a case where the one member is brought into contact with another member, but also a case where still another member is present between the two members.

Throughout the specification, the term "step . . ." or "step of . . ." does not mean "step for . . .".

In the present invention, a Faraday cage means a sealed space made of a conductor. When the Faraday cage is installed in plasma, a sheath is formed on an outer surface of the Faraday cage, and a constant electric field is maintained in the Faraday cage. In this case, when an upper surface of the Faraday cage is formed as a mesh part, the sheath is formed along a surface of the mesh part. Therefore, in a case in which plasma etching is performed by using the Faraday cage, ions, which accelerate in a direction perpendicular to the sheath formed in parallel with the surface of the mesh part, enter the Faraday cage and then reach a base while maintaining directionality set when the ions enter the Faraday cage, thereby etching the base. Further, in the present invention, a surface of the molding base in the Faraday cage may be fixed to be parallel or inclined with respect to the surface of the mesh part, and the ions enter in the direction perpendicular to the surface of the mesh part, such that the etching may be performed in the direction perpendicular or inclined with respect to the surface of the molding base. In addition, the Faraday cage may be an electrically conductive cage including the mesh part having the upper surface having conductivity.

In the case of plasma etching using the Faraday cage, ions having passed through the mesh part lose their kinetic energy by colliding with neutral particles existing in the Faraday cage while moving toward the base, and as a result, density of the ions tend to be inversely proportional to a distance from the mesh part. That is, an etching speed becomes higher as the distance from the mesh part where the ions enter is decreased, and the etching speed becomes lower as the distance from the mesh part is increased.

The present inventors have developed the following invention by studying a method of manufacturing a mold for a diffraction grating light guide plate by using the Faraday cage having the above-mentioned characteristics and specifically studying a method of effectively manufacturing a mold for a diffraction grating light guide plate, the mold having pattern portions provided in four independent regions.

Hereinafter, the present specification will be described in more detail.

An exemplary embodiment of the present invention provides a method of manufacturing a mold for a diffraction grating light guide plate, the method including: preparing a first mask film including first and second openings each formed in an independent region; attaching the first mask film to one surface of a molding base, opening only the first opening, positioning the molding base with the first mask film attached thereto in a Faraday cage having a mesh part provided on an upper surface thereof, and then forming, by using plasma etching, a first pattern portion in a first region of one surface of the molding base which is exposed through the first opening; and opening only the second opening, and then forming, by using plasma etching, a second pattern portion in a second region of one surface of the molding base which is exposed through the second opening, in which the first mask film includes a first base and a first adhesive layer provided on one surface of the first base, a glass transition temperature of the first base is 70° C. or more and 100° C. or less, and adhesive force of the first adhesive layer is 30 gf/in or more and 50 gf/in or less.

The method of manufacturing a mold for a diffraction grating light guide plate according to the exemplary embodiment of the present invention may efficiently manufacture the mold for a diffraction grating light guide plate, the mold including various types of pattern portions provided on one surface thereof.

FIG. 1A is a view illustrating a first mask film having first and second openings according to an exemplary embodiment of the present invention, FIG. 1B is a view illustrating a second mask film having a third opening, and FIG. 1C is a view illustrating the first mask film having the first opening, the second opening, and an additional fourth opening. Specifically, FIG. 1A is a view illustrating a first mask film 200 having first and second openings H1 and H2 formed in independent regions, and FIG. 1C is a view illustrating a first mask film 200' having the first opening H1, the second opening H2, and a fourth opening H4 formed in the independent regions. In addition, FIG. 1B is a view illustrating a second mask film 300 having a third opening H3 formed in one region.

According to the exemplary embodiment of the present invention, a method of cutting a member, which is used in the art, may be used, without limitation, as a method of forming the first and second openings in the regions of the first mask film. For example, the first mask film may be cut by a knife or a laser in accordance with the desired shapes of the first and second openings. Specifically, in the present invention, the first and second openings may be formed in the first mask film by the laser cutting to improve cutting efficiency and cutting accuracy. In addition, the third opening may be formed in the second mask film and the fourth opening may be additionally formed in the first mask film by the method identical to the above-mentioned method.

According to an exemplary embodiment of the present invention, the molding base may be a quartz substrate or a silicon wafer. During the etching process using plasma etching, particularly, an induced coupled plasma reactive ion etching (ICP-RIE) device, there may occur a problem in that a needle-like structure having low reflectance is formed in an etching region by a self-masking mechanism. However, according to the exemplary embodiment of the present invention, since the quartz substrate or the silicon wafer is used as the molding base, it is possible to effectively inhibit a needle-like structure from being formed during the process of forming the first to fourth pattern portions by etching one surface of the molding base.

According to the exemplary embodiment of the present invention, one surface of the molding base is plasma-etched by using the Faraday cage having the mesh part provided on the upper surface thereof, such that it is possible to form the first and second pattern portions on the molding base, and to form the additional third and fourth pattern portions on the molding base. During the plasma etching, the mesh part may form a sheath by attracting free electrons from a contact surface with plasma. In addition, the mesh part may have conductivity and thus attract and accelerate ions having positive charges. Further, the mesh part may be provided flat on one surface of the Faraday cage. If the mesh part has a curved portion, an etching speed may locally vary at the curved portion.

According to the exemplary embodiment of the present invention, the mesh part may have surface resistance of 0.5 Ω/sq or more. Specifically, the surface resistance of the mesh part may be 0.5 Ω/sq or more and 100 Ω/sq or less. In a case in which the molding base is plasma-etched by using the Faraday cage in the related art, there is a problem in that plasma etching accuracy deteriorates because a high etching region and a low etching region are irregularly mixed for each position of the Faraday cage. In contrast, according to the exemplary embodiment of the present invention, the high etching region and the low etching region may be constantly formed in the Faraday cage during the plasma etching by adjusting the surface resistance of the mesh part to the above-mentioned range. That is, the first to fourth pattern portions may be formed by precisely etching the molding base. In addition, when the surface resistance of the mesh part is within the above-mentioned range, manufacturing costs for the Faraday cage may be reduced and etching efficiency may be improved.

According to the exemplary embodiment of the present invention, the mesh part may be made by adsorbing a fluorocarbon radical to a metal mesh. Specifically, the fluorocarbon radical may be —CF, —CF$_2$, —CF$_3$, or —C$_2$F$_x$ (x is an integer of 1 to 5). More specifically, in the case of the mesh part of the Faraday cage, the fluorocarbon radical may be adsorbed to the mesh part by etching by an F radical and surface polymerization during the plasma etching. In addition, the mesh part may have the surface resistance within the above-mentioned range as the fluorocarbon radical is adsorbed to a substance such as metal having conductivity.

According to the exemplary embodiment of the present invention, the mesh part may use a mesh made of a stainless material. Specifically, a commercially available #200 mesh made of an SUS304 material (having a pitch of 125 μm, a wire diameter of 50 μm, and an aperture ratio or 36%). However, the material of the mesh part is not limited, and the mesh part may be made of Al, Cu, W, Ni, Fe, or an alloy including at least two thereof. In addition, a porosity and a grating size of the mesh may be freely adjusted for the purpose of etching.

FIG. 2A is a view illustrating a step of forming the first pattern portion according to the exemplary embodiment of the present invention, FIG. 2B is a view illustrating a step of forming the second pattern portion, FIG. 2C is a view illustrating a step of forming the third pattern portion, and FIG. 2D is a view illustrating a step of forming the fourth pattern portion.

According to the exemplary embodiment of the present invention, the forming of the first pattern portion may open only the first opening of the first mask film and form the first pattern portion on the surface of the molding base which is exposed through the first opening. The second opening may be shielded such that only the first opening of the first mask film having the first and second openings is opened. Specifically, the second opening may be shielded by attaching an additional film to the second opening. The additional film may be made by cutting a film identical to the first or second mask film into an appropriate size.

According to an exemplary embodiment of the present invention, the forming of the first pattern portion may include positioning the molding base one surface thereof inclined with respect to a bottom surface of the Faraday cage, and performing the plasma etching to form an inclined pattern portion. Referring to FIG. 2A, the forming of the first pattern portion may position a molding base 100 on a support 430 having an inclined surface and perform inclined plasma etching in the first region of the molding base 100. Therefore, it is possible to form the first pattern portion having an inclination in the first region of the molding base.

According to the exemplary embodiment of the present invention, an inclination angle of the support with respect to the bottom surface of the Faraday cage may be 0° or more and 60° or less, or 35° or more and 45° or less. The inclination angle of the first pattern portion may be adjusted by adjusting the inclination angle of the support.

An average inclination angle of the first pattern portion may be adjusted to 0° to 55°, or 30° to 40°, by adjusting the inclination angle of the support to the above-mentioned range. For example, when the inclination angle of the support is adjusted to 35°, a minimum inclination angle of the first pattern portion may be adjusted to 27°, a maximum inclination angle thereof may be adjusted to 36°, and an average inclination angle thereof may be adjusted to 33°. In addition, when the inclination angle of the support is adjusted to 40°, the minimum inclination angle of the first pattern portion may be adjusted to 32°, the maximum inclination angle thereof may be adjusted to 40°, and the average inclination angle thereof may be adjusted to 36°.

According to an exemplary embodiment of the present invention, the forming of the second pattern portion may include positioning the molding base with one surface thereof inclined with respect to the bottom surface of the Faraday cage, shielding at least a part of the mesh part by using a shutter, and then performing the plasma etching to form an inclined pattern portion having a depth gradient.

In a case in which the plasma etching is performed by using the Faraday cage in the related art having no shutter, a degree of change in etching rate cannot be adjusted to a desired level because the etching rate is determined based on a distance from the mesh part of the Faraday cage to the molding base. In contrast, according to the exemplary embodiment of the present invention, since a part of the mesh part of the Faraday cage is shielded by using the shutter, a degree of change in etching rate in accordance with an increase in distance from the mesh part to the molding base may be adjusted to be greater in an etching region adjacent to the region shielded by the shutter. That is, since the degree of change in etching rate is adjusted to be greater by shielding a part of the mesh part with the shutter, it is possible to easily form the second pattern portion having a depth gradient in the second region of the molding base.

Specifically, the forming of the second pattern portion may form the second pattern portion having a depth gradient at a desired level by a method that forms a pattern in the entire second region by performing the plasma etching without using a shutter, shields a part of the mesh part with the shutter, and then performs the plasma etching. Referring to FIG. 2B, the forming of the second pattern portion may include a process of positioning the molding base 100 on the support 430 having an inclined surface, shielding a part of a mesh part 410 with a shutter 420, and then performing inclined plasma etching. Therefore, it is possible to form the second pattern portion in the form of an inclined pattern having a depth gradient in the second region of the molding base.

According to the exemplary embodiment of the present invention, the method of manufacturing a mold for a diffraction grating light guide plate may further include: preparing a second mask film having a third opening formed in one region thereof and removing the first mask film from one surface of the molding base; and attaching the second mask film to one surface of the molding base and forming, by using plasma etching, a third pattern portion in a third region of one surface of the molding base which is exposed through the third opening.

That is, the first and second pattern portions are formed on one surface of the molding base by using the first mask film having the first and second openings, and then the first mask film may be removed from one surface of the molding base. Thereafter, the third pattern portion may be formed on one surface of the molding base by attaching the second mask film to one surface of the molding base having the first and second pattern portions and performing the plasma etching. In addition, the first pattern portion, the second pattern portion, and a fourth pattern portion are formed on one surface of the molding base by using the first mask film having the first opening, the second opening, and the fourth opening, and then the third pattern portion may be formed on one surface of the molding base by using the second mask film.

According to the exemplary embodiment of the present invention, the forming of the third pattern portion may include positioning the molding base with one surface thereof in parallel with the bottom surface of the Faraday cage, shielding at least a part of the mesh part by using the shutter, and then performing the plasma etching to form the pattern portion having a depth gradient. Specifically, the forming of the third pattern portion may form the third pattern portion having a depth gradient at a desired level by a method that forms a pattern in the entire third region by performing the plasma etching without using a shutter, shields a part of the mesh part with the shutter, and then performs the plasma etching. Referring to FIG. 2C, the forming of the third pattern portion may include a process of positioning the molding base 100 in parallel with the bottom surface of a Faraday cage 400, shielding a part of the mesh part 410 with the shutter 420, and then performing inclined plasma etching. Therefore, it is possible to form the third pattern portion in the form of an inclined pattern having a depth gradient in the third region of the molding base.

According to the exemplary embodiment of the present invention, the shutter may shield 20% or more and 80% or less of the mesh part. Specifically, the shutter may shield a region of 30% or more and 60% or less of the mesh part or a region of 40% or more and 60% or less. More specifically, the shutter may shield a region of 50% of the mesh part. In addition, the shutter may continuously shield a predetermined region of the mesh part.

FIGS. 3(*a*) and 3(*b*) are photographs of the Faraday cage according to the exemplary embodiment of the present invention. Specifically, FIG. 3(*a*) is a captured image of the surface of the mesh part of the Faraday cage having no shutter, and FIG. 3(*b*) is a captured image of the surface of the mesh part of the Faraday cage having the shutter.

According to the exemplary embodiment of the present invention, the shutter may be made of an aluminum oxide material, but the material of the shutter is not limited, and the shutter may be made of various materials that are not etched by the plasma.

According to an exemplary embodiment of the present invention, the first mask film additionally includes a fourth opening, and the method of manufacturing a mold for a diffraction grating light guide plate may further include opening only the fourth opening and then forming, by using plasma etching, the fourth pattern portion in a fourth region of one surface of the molding base which is exposed through the fourth opening.

According to the exemplary embodiment of the present invention, the forming of the fourth pattern portion may include positioning the molding base with one surface thereof in parallel with the bottom surface of the Faraday cage, and performing the plasma etching. Referring to FIG. 2D, the forming of the fourth pattern portion may include a process of forming the fourth pattern portion having substantially no depth gradient by positioning the molding base 100 on the bottom surface of the Faraday cage 400, and performing the plasma etching. In the present invention, having substantially no depth gradient may mean that the pattern portion has the completely constant depth (height) or the pattern portion has a depth gradient of 20 nm or less for each length of 5 mm such that the entire pattern portion has substantially constant optical and physical properties.

FIG. 4 is a view illustrating one surface of a mold for a diffraction grating light guide plate, the mold manufactured by the method of manufacturing a mold for a diffraction grating light guide plate according to an exemplary embodiment of the present invention. Referring to FIG. 4, a first pattern portion P1, which has no depth gradient but has an inclined shape, may be provided in a first region of one surface of a mold 1000 for a diffraction grating light guide plate, and a second pattern portion P2, which has a depth gradient and an inclined shape, may be provided in a second region of one surface of the mold 1000. In addition, a third pattern portion P3, which has a depth gradient but is not inclined, may be provided in a third region, and a fourth pattern portion P4, which has no depth gradient and is not inclined, may be provided in a fourth region.

According to the exemplary embodiment of the present invention, an inclination direction of the first pattern portion and an inclination direction of the second pattern portion may be opposite to each other. During the process of forming the first and second pattern portions, the inclination direction of the pattern portion may be changed by adjusting a direction in which one side and the other side of the molding base are positioned. In addition, during the process of forming the first and second pattern portions, the inclination direction of the pattern portion may be changed by adjusting the inclination directions of the molding base and the bottom surface of the Faraday cage. Referring to FIGS. 2A and 2B, the inclination direction of the inclined pattern of the first pattern portion and the inclination direction of the inclined pattern of the second pattern portion may be opposite to each other as one side and the other side of the molding base 100 are positioned differently at positions adjacent to the mesh part of the Faraday cage.

According to an exemplary embodiment of the present invention, the depth gradient of the third pattern portion may be more than 20 nm and 40 nm or less for each length of 5 mm of the pattern portion. However, the depth gradient of the third pattern portion is not limited to the above-mentioned range, and the depth gradient may be changed based on design factors in respect to the mold for a diffraction grating light guide plate.

According to an exemplary embodiment of the present invention, the second pattern portion may have the depth gradient such that a depth of the pattern positioned at one side where the pattern is started is about 40 nm, and a depth of the pattern positioned at the other side where the pattern is ended is about 350 nm. However, the depth gradient of the second pattern portion is not limited to the above-mentioned range, and the depth gradient may be changed based on design factors in respect to the mold for a diffraction grating light guide plate.

According to an exemplary embodiment of the present invention, the plasma etching may be performed by using an induced coupled plasma reactive ion etching (ICP-RIE) device. Specifically, the plasma etching process may be performed by the Faraday cage provided in the induced coupled plasma reactive ion etching device. In addition, a helicon plasma method, a helical resonance plasma method, an electron resonance plasma method, and the like may also be applied to the plasma etching.

According to an exemplary embodiment of the present invention, the plasma etching may include adjusting an output of a plasma etching device to 0.75 kW or more and 4 kW or less. Specifically, the output of the plasma etching device may be adjusted to 0.75 kW or more and 3 kW or less, 0.75 kW or more and 1.5 kW or less, or 0.75 kW or more and 1 kW or less. The first to fourth pattern portions may be more precisely formed on the molding base by adjusting the output of the plasma etching device to the above-mentioned range. In addition, when the output of the plasma etching device is within the above-mentioned range, it is possible to further inhibit a needle-like structure from being formed during the process of etching the molding base and to remarkably reduce a size of the formed needle-like structure.

According to the exemplary embodiment of the present invention, the plasma etching may include supplying the plasma etching device with a gas mixture including a reactive gas and an oxygen gas at a supply flow rate of 10 sccm or more and 75 sccm or less. Specifically, the plasma etching device may be supplied with the gas mixture at a supply flow rate of 15 sccm or more and 75 sccm or less, 25 sccm or more and 70 sccm or less, 30 sccm or more and 70 sccm or less, 40 sccm or more and 60 sccm or less, or 45 sccm or more and 55 sccm or less. When the supply flow rate of the gas mixture is adjusted to the above-mentioned range, it is possible to stably form the first to fourth pattern portions on the molding base. In addition, when the supply flow rate of the gas mixture is adjusted to the above-mentioned range, it is possible to further inhibit a needle-like structure from being formed during the process of etching the molding base and to remarkably reduce a size of the formed needle-like structure.

According to the exemplary embodiment of the present invention, a general reactive gas used for plasma etching may be used as the reactive gas. For example, a gas such as $SF_6$, $CHF_3$, $C_4F_8$, $CF_4$, and $Cl_2$ may be used.

According to the exemplary embodiment of the present invention, a ratio of a flow rate of the oxygen gas to the overall flow rate of the gas mixture may be 1% or more and 20% or less. Specifically, the ratio of the flow rate of the oxygen gas to the overall flow rate of the gas mixture may be 1% or more and 15% or less, 1% or more and 10% or less, or 1% or more and 5% or less. When the ratio of the flow rate of the oxygen to the overall flow rate of the gas mixture is within the above-mentioned range, it is possible to further inhibit a needle-like structure from being formed during the process of etching the molding base and to remarkably reduce a size of the formed needle-like structure.

According to an exemplary embodiment of the present invention, the second to fourth pattern portions may be formed after the first pattern portion is formed on the molding base, or the first pattern portion may be formed after the second to fourth pattern portions are formed on the molding base.

Hereinafter, the description will focus on the first mask film having the first opening, the second opening, and the fourth opening.

According to an exemplary embodiment of the present invention, the first mask film may include the first base and a first adhesive layer provided on one surface of the first base, a glass transition temperature of the first base may be 70° C. or more and 100° C. or less, and adhesive force of the first adhesive layer may be 30 gf/in or more and 50 gf/in or less. Specifically, the glass transition temperature of the first base may be 80° C. or more and 90° C. or less, or 85° C. or more and 90° C. or less. In addition, a melting point of the first base may be 250° C. or more and 300° C. or less, or 265° C. or more and 290° C. or less. In addition, at a temperature of 25° C., the adhesive force of the first adhesive layer may be 30 gf/in or more and 50 gf/in or less, 35 gf/in or more and 40 gf/in or less, 30 gf/in or more and 37 gf/in or less, or 38 gf/in or more and 45 gf/in or less, with respect to a base made of stainless steel 304.

According to an exemplary embodiment of the present invention, a polyethylene terephthalate base having the above-mentioned glass transition temperature and/or the above-mentioned melting point may be used as the first base. In addition, a silicon-based adhesive layer having the above-mentioned adhesive force may be used as the first adhesive layer.

According to an exemplary embodiment of the present invention, in the forming of the first pattern portion, a surface temperature of the molding base may be 155° C. or more and 165° C. or less. In addition, in the forming of the fourth pattern portion, the surface temperature of the molding base may be 150° C. or more and 160° C. or less.

In addition, in the forming of the second pattern portion, the surface temperature of the molding base may be 100° C. or more and 150° C. or less. The forming of the second pattern portion may be performed by performing the plasma etching twice. The pattern portion may be formed in the entire second region without a shutter, and in this case, the surface temperature of the molding base may be 100° C. or more and 115° C. or less. In addition, the pattern may be formed in the entire second region, a part of the mesh part may be shielded by the shutter, and then the plasma etching may be performed. In this case, the surface temperature of the molding base, which is not shielded by the shutter, may be 130° C. or more and 150° C. or less.

Therefore, the first mask film, which includes the first base having the above-mentioned glass transition temperature and/or the above-mentioned melting point, may effectively withstand a thermal shock during the plasma etching process of forming the first pattern portion, the second pattern portion, and the fourth pattern portion. In addition, by adjusting the adhesive force of the first adhesive layer to the above-mentioned range, it is possible to prevent the first mask film from being separated from one surface of the molding base during the plasma etching process of forming the first pattern portion, the second pattern portion, and the fourth pattern portion. In addition, when the adhesive force of the first adhesive layer is within the above-mentioned range, it is possible to effectively inhibit the reactive gas from penetrating between the first adhesive layer and the molding base and to inhibit bubbles from being formed between the first adhesive layer and the molding base during the process of forming the first pattern portion, the second pattern portion, and the fourth pattern portion. Therefore, it is possible to effectively prevent damage to one surface of the molding base. In addition, when the adhesive force of the first adhesive layer is within the above-mentioned range, it is possible to easily separate the first mask film after completing the process of forming the first pattern portion, the second pattern portion, and the fourth pattern portion, and it is possible to effectively inhibit a residue of the adhesive layer from remaining on one surface of the molding base even after the first mask film having received a thermal shock is separated.

According to an exemplary embodiment of the present invention, a thickness of the first base may be 30 µm or more and 50 µm or less, and a thickness of the first adhesive layer may be 5 µm or more and 20 µm or less. Specifically, the thickness of the first base may be 35 µm or more and 40 µm or less, and the thickness of the first adhesive layer may be 10 µm or more and 15 µm or less. By adjusting the thickness of the first base to the above-mentioned range, it is possible to easily handle the first mask film. In addition, when the thickness of the first base is within the above-mentioned range, the first mask film may have excellent thermal shock characteristics during the process of forming the first pattern portion, the second pattern portion, and the fourth pattern portion.

In addition, by adjusting the thickness of the first adhesive layer to the above-mentioned range, it is possible to effectively inhibit a residue of the adhesive layer from remaining on one surface of the molding base even after the first mask film is separated. Furthermore, by adjusting the thickness of the first base and the thickness of the first adhesive layer to the above-mentioned ranges, it is possible to improve durability of the first mask film and to effectively inhibit a degree to which shadowing occurs in accordance with the thickness of the first mask film.

According to an exemplary embodiment of the present invention, the second mask film may include a second base and a second adhesive layer provided on one surface of the second base, a glass transition temperature of the second base may be 230° C. or more and 350° C. or less, and adhesive force of the second adhesive layer may be 30 gf/in or more and 80 gf/in or less. Specifically, the glass transition temperature of the second base may be 250° C. or more and 320° C. or less, 280° C. or more and 310° C. or less, or 285° C. or more and 300° C. or less. In addition, a melting point of the second base may be 350° C. or more and 450° C. or less. Specifically, the melting point of the second base may be 370° C. or more and 430° C. or less, or 390° C. or more and 410° C. or less. In addition, at a temperature of 25° C., the adhesive force of the second adhesive layer may be 30 gf/in or more and 80 gf/in or less, 55 gf/in or more and 65 gf/in or less, 50 gf/in or more and 60 gf/in or less, or 65 gf/in or more and 70 gf/in or less, with respect to the base made of stainless steel 304.

According to an exemplary embodiment of the present invention, a polyimide base having the above-mentioned glass transition temperature may be used as the second base. In addition, a silicon-based adhesive layer having the above-mentioned adhesive force may be used as the second adhesive layer.

According to the exemplary embodiment of the present invention, the glass transition temperatures of the first base and the second base may be measured by using a method and a device that are generally used in the art.

According to an exemplary embodiment of the present invention, in the forming of the third pattern portion, a surface temperature of the molding base may be 110° C. or more and 200° C. or less. The forming of the third pattern portion may be performed by performing the plasma etching twice. The pattern portion may be formed in the entire third region without a shutter, and in this case, the surface temperature of the molding base may be 110° C. or more and 130° C. or less. In addition, the pattern may be formed in the entire third region, a part of the mesh part may be shielded by the shutter, and then the plasma etching may be performed. In this case, the surface temperature of the molding base, which is not shielded by the shutter, may be 180° C. or more and 190° C. or less.

Therefore, the second mask film, which includes the second base having the above-mentioned glass transition temperature and/or the above-mentioned melting point, may withstand a thermal shock during the plasma etching process of forming the third pattern portion. Specifically, when the glass transition temperature and/or the melting point of the second base are/is within the above-mentioned range, it is possible to effectively inhibit the molding base from being damaged by the plasma etching in a region protected by the second mask film, that is, in a region except for the third region.

In addition, by adjusting the adhesive force of the second adhesive layer to the above-mentioned range, it is possible to prevent the second mask film from being separated from one surface of the molding base during the plasma etching process of forming the third pattern portion. In addition, when the adhesive force of the second adhesive layer is within the above-mentioned range, it is possible to effectively inhibit the reactive gas from penetrating between the second adhesive layer and the molding base and to inhibit bubbles from being formed between the second adhesive layer and the molding base during the process of forming the third pattern portion. Therefore, it is possible to effectively prevent damage to one surface of the molding base. In addition, when the adhesive force of the second adhesive layer is within the above-mentioned range, it is possible to easily separate the second mask film after completing the process of forming the third pattern portion, and it is possible to effectively inhibit a residue of the adhesive layer from remaining on one surface of the molding base even after the second mask film having received a thermal shock is separated.

According to an exemplary embodiment of the present invention, a thickness of the second base may be 30 µm or more and 70 µm or less, and a thickness of the second adhesive layer may be 5 µm or more and 20 µm or less. Specifically, the thickness of the second base may be 45 µm or more and 55 µm or less, and the thickness of the second adhesive layer may be 5 µm or more and 8 µm or less. By adjusting the thickness of the second base to the above-mentioned range, it is possible to easily handle the second mask film. In addition, when the thickness of the second base is within the above-mentioned range, the second mask film may have excellent thermal shock characteristics during the process of forming the third pattern portion.

In addition, by adjusting the thickness of the second adhesive layer to the above-mentioned range, it is possible to effectively inhibit a residue of the adhesive layer from remaining on one surface of the molding base even after the second mask film is separated. Furthermore, by adjusting the thickness of the second base and the thickness of the second adhesive layer to the above-mentioned ranges, it is possible to improve durability of the second mask film and to effectively inhibit a degree to which shadowing occurs in accordance with the thickness of the second mask film.

In the present invention, during the plasma etching process, the surface temperature of the molding base may be measured by using a temperature detecting tape. For example, the temperature detecting tape may be attached to the surface of the molding base, and then the surface temperature of the molding base may be measured under a plasma etching process condition for forming the first to fourth pattern portions.

The method of manufacturing a mold for a diffraction grating light guide plate according to an exemplary embodiment of the present invention may use the optimum first and second mask films capable of improving efficiency in forming the pattern portion, thereby effectively reducing time and costs required to manufacture a mold for a diffraction grating light guide plate. In addition, the method of manufacturing a mold for a diffraction grating light guide plate has a process advantage in that the method may use the two mask films, that is, the first and second mask films, and manufacture a mold for a diffraction grating light guide plate through a single replacement process.

In addition, according to an exemplary embodiment of the present invention, it is also possible to manufacture a mold for a diffraction grating light guide plate by using a third mask film having the second and third openings each formed in the independent region and a fourth mask film having the first and fourth openings each formed in the independent region.

In this case, the second and third openings of the third mask film and the first and fourth openings of the fourth mask film may be formed at positions corresponding to the positions at which the first to fourth openings of the first and second mask films are formed. In addition, the third mask film may be of the same type as the first mask film, and the fourth mask film may be of the same type as the second mask film.

Another exemplary embodiment of the present invention provides a method of manufacturing a diffraction grating light guide plate, the method including: preparing a mold for a diffraction grating light guide plate manufactured by the method of manufacturing a mold for a diffraction grating light guide plate; applying a resin composition onto one surface of the mold for a diffraction grating light guide plate, the surface having pattern portions; and curing the resin composition.

According to an exemplary embodiment of the present invention, a resin composition, which is generally used in the art, may be as the resin composition without limitation. Furthermore, the applying of the resin composition may be performed by using a coating method such as spin coating, dip coating, or drop casting generally used in the art. In addition, a curing method, which is generally used in the art, may be used, without limitation, as the method of curing the resin composition. As an example, a photocuring method may be used when a photocurable resin composition is used, and a heat-curing method may be used when a thermoset resin composition is used.

According to an exemplary embodiment of the present invention, the manufactured diffraction grating light guide plate may include a pattern portion provided in a first region DOE 1 which light enters, a pattern portion provided in a second region DOE 2 in which the incident light travels while diffusing, a pattern portion provided in a third region DOE 3 from which the traveling light exits, and a pattern portion provided in a fourth region DOE 2-2 which guides the traveling light from the second region to the third region. Referring to FIG. 4, the pattern portion provided in DOE 1 of the manufactured diffraction grating light guide plate may correspond to the first pattern portion P1 of the mold 1000 for a diffraction grating light guide plate. In addition, the pattern portion provided in DOE 2 of the diffraction grating light guide plate may correspond to the third pattern portion P3 of the mold 1000 for a diffraction grating light guide plate, and the pattern portion provided in DOE 2-2 of the diffraction grating light guide plate may correspond to the fourth pattern portion P4 of the mold 1000 for a diffraction grating light guide plate. In addition, the pattern portion provided in DOE 3 of the diffraction grating light guide plate may correspond to the second pattern portion P2 of the mold 1000 for a diffraction grating light guide plate.

According to an exemplary embodiment of the present invention, the diffraction grating light guide plate may be used as a direct diffraction grating light guide plate. In addition, the diffraction grating light guide plate may be used as an intermediate mold, and a final product may be manufactured by a method of reproducing the diffraction grating light guide plate. Specifically, in the case in which the diffraction grating light guide plate is manufactured by using the manufactured diffraction grating light guide plate as the intermediate mold, it is possible to obtain the diffraction grating light guide plate having a gradient reverse to the gradient of the grating pattern of the diffraction grating light guide plate used as the intermediate mold. Furthermore, in a case in which a diffraction grating light guide plate is manufactured after a mold for a diffraction grating light guide plate is manufactured by using the diffraction grating light guide plate, of which the gradient of the grating pattern is reversed, as the intermediate mold, it is possible to implement a grating pattern in a direction identical to the direction of the initial diffraction grating light guide plate.

EXAMPLES

Hereinafter, Examples will be described in detail to specifically describe the present invention. However, Examples according to the present invention may be modified in various different forms, and it is not interpreted that the scope of the present invention is limited to the following Examples. The Examples of the present specification are provided to further completely explain the present invention to those skilled in the art.

Preparation of Mask Film

Example 1: Second Mask Film

A polyimide (PI) film having a glass transition temperature of about 280° C., a melting point of about 390° C., and a thickness of about 50 μm was prepared as a base. In addition, a silicon-based adhesive film having a thickness of about 6 μm was prepared as an adhesive layer. Thereafter, a mask film was manufactured by attaching the adhesive film to one surface of the PI film. A sample was manufactured by cutting the manufactured mask film into a width of 2.54 cm and a length of 30 cm, and the sample was attached to one surface of stainless steel 304. Thereafter, based on an ASTM D3330 evaluation method, force applied when the sample is separated from the stainless steel 304 was measured, and the force was about 60 gf/in.

Example 2: First Mask Film

A polyethylene terephthalate (PET) film having a glass transition temperature of about 85° C., a melting point of about 280° C., and a thickness of about 38 μm was prepared as a base. In addition, a silicon-based adhesive film having a thickness of about 10 μm was prepared as an adhesive layer. Thereafter, a mask film was manufactured by attaching the adhesive film to one surface of the PET film. Thereafter, adhesive force of the adhesive layer was measured by the same method as in Example 1, and the adhesive force of the adhesive layer was about 40 gf/in.

Comparative Example 1

A PET film having a thickness of about 25 μm according to Example 2 was prepared as a base, and a silicon-based adhesive film having a thickness of about 8 μm was prepared as an adhesive layer. Thereafter, a mask film was manufactured by attaching the adhesive film to one surface of the PET film. Thereafter, adhesive force of the adhesive layer was measured by the same method as in Example 1, and the adhesive force of the adhesive layer was about 25 gf/in.

Comparative Example 2

A PI film having a thickness of about 25 μm according to Example 1 was prepared as a base, and an acrylate-based adhesive film having a thickness of about 25 μm was prepared as an adhesive layer. Thereafter, a mask film was manufactured by attaching the adhesive film to one surface of the PI film. Thereafter, adhesive force of the adhesive layer was measured by the same method as in Example 1, and the adhesive force of the adhesive layer was about 70 gf/in.

Comparative Example 3

A PI film having a thickness of about 25 μm according to Example 1 was prepared as a base, and a silicon-based adhesive film having a thickness of about 10 μm was prepared as an adhesive layer. Thereafter, a mask film was manufactured by attaching the adhesive film to one surface of the PI film. Thereafter, adhesive force of the adhesive layer was measured by the same method as in Example 1, and the adhesive force of the adhesive layer was about 10 gf/in.

Comparative Example 4

A PI film having a thickness of about 25 μm according to Example 1 was prepared as a base, and a silicon-based adhesive film having a thickness of about 10 μm was prepared as an adhesive layer. Thereafter, a mask film was manufactured by attaching the adhesive film to one surface of the PI film. Thereafter, adhesive force of the adhesive layer was measured by the same method as in Example 1, and the adhesive force of the adhesive layer was about 80 gf/in.

Comparative Example 5

A PI film having a thickness of about 50 μm according to Example 1 was prepared as a base, and a silicon-based adhesive film having a thickness of about 10 μm was prepared as an adhesive layer. Thereafter, a mask film was manufactured by attaching the adhesive film to one surface of the PI film. Thereafter, adhesive force of the adhesive layer was measured by the same method as in Example 1, and the adhesive force of the adhesive layer was about 10 gf/in.

Measurement of Surface Temperature of Molding Base During Plasma Etching Process A Faraday cage, which had a mesh part having surface resistance of 0.5605 Ω/sq and a bottom surface formed as a stainless (SUS304) plate, was prepared. Further, the Faraday cage was provided in an induced coupled plasma reactive ion etching (ICP-RIE) device (plasmaLab system 100 manufactured by Oxford Instruments).

A quartz substrate was prepared as a molding base, and a temperature detecting tape was attached to one surface of the quartz substrate.

Forming a First Pattern Portion

A support, which was made of an aluminum material and had an inclination of 40°, was installed in the Faraday cage, and then the quartz substrate attached with the temperature detecting tape was positioned on the support. In this case, there was no shielding of a mesh part using a separate shutter.

Thereafter, plasma etching was performed by using the ICP-RIE device (plasmaLab system 100 manufactured by Oxford Instruments), and a reactive gas made by mixing $O_2$ and $C_4F_8$ at a ratio of 5:45 was supplied at a flow velocity of 50 sccm. In addition, the etching was performed for 4 minutes under an etching condition in which ICP power was 2 kW, RF power was 150 W, and operating pressure was 7 to 10 mTorr. In this case, the highest temperature among surface temperatures of the quartz substrate, which were measured by the temperature detecting tape, was about 160° C.

Forming a Second Pattern Portion

A support, which was made of an aluminum material and had an inclination of 40°, was installed in the Faraday cage, and then the quartz substrate attached with the temperature detecting tape was positioned on the support. In this case, there was no shielding of a mesh part using a separate shutter.

Thereafter, the reactive gas was supplied under the same condition as in the forming of the first pattern portion, and the etching was performed for 4 minutes under the condition in which ICP power was 2 kW, RF power was 150 W, and operating pressure was 7 to 10 mTorr. In this case, the highest temperature among surface temperatures of the quartz substrate, which were measured by the temperature detecting tape, was about 110° C.

Thereafter, the shutter was positioned on the mesh part so that half of the region of the quartz base was shielded with the shutter. The reactive gas was supplied under the same condition as in the forming of the first pattern portion, and the etching was performed for 5 minutes under the condition in which ICP power was 2 kW, RF power was 150 W, and operating pressure was 7 to 10 mTorr. In this case, the highest temperature among surface temperatures in a region of the quartz base, which was not shielded by the shutter, was about 140° C.

Forming a Third Pattern Portion

The quartz substrate attached with the temperature detecting tape was positioned in the Faraday cage and on the bottom surface of the Faraday cage, and there was no shielding of the mesh part using a separate shutter.

Thereafter, the reactive gas was supplied under the same condition as in the forming of the first pattern portion, and the etching was performed for 3 minutes under the condition in which ICP power was 2 kW, RF power was 150 W, and operating pressure was 7 to 10 mTorr. In this case, the highest temperature among surface temperatures of the quartz substrate, which were measured by the temperature detecting tape, was about 125° C.

Thereafter, the shutter was positioned on the mesh part so that half of the region of the quartz base was shielded with the shutter. The reactive gas was supplied under a condition identical to the above-mentioned condition, and the etching was performed for 7 minutes under the condition in which ICP power was 2 kW, RF power was 150 W, and operating pressure was 7 to 10 mTorr. In this case, the highest temperature among surface temperatures in a region of the quartz base, which was not shielded by the shutter, was about 190° C.

Forming a Fourth Pattern Portion

The quartz substrate attached with the temperature detecting tape was positioned in the Faraday cage and on the bottom surface of the Faraday cage, and there was no shielding of the mesh part using a separate shutter.

Thereafter, the reactive gas was supplied under the same condition as in the forming of the first pattern portion, and the etching was performed for 4 minutes under the condition in which ICP power was 2 kW, RF power was 150 W, and operating pressure was 7 to 10 mTorr. In this case, the highest temperature among surface temperatures of the quartz substrate, which were measured by the temperature detecting tape, was about 155° C.

Mask Film Test (General ICP-RIE)

The quartz base attached with the temperature detecting tape was positioned in the induced coupled plasma reactive ion etching (ICP-RIE) device (plasmaLab system 100 manufactured by Oxford Instruments). Thereafter, the reactive gas made by mixing $O_2$ and $C_4F_8$ at a ratio of 5:45 was supplied at a flow velocity of 50 sccm. In addition, the etching was performed for 4 minutes under the etching condition in which ICP power was 2 kW, RF power was 150 W, and operating pressure was 7 to 10 mTorr. In this case, it was ascertained that an average surface temperature of the quartz substrate measured by the temperature detecting tape was about 235° C.

The mask films according to Examples 1 and 2 and Comparative Examples 1 to 5 were prepared, and the openings were formed in predetermined regions of the mask films. Thereafter, quartz base samples attached with the mask films according to Examples 1 and 2 and Comparative Examples 1 to 5 are positioned in the induced coupled plasma reactive ion etching device, and the plasma etching was performed under the condition identical to the above-mentioned condition.

FIGS. 5(a) and 5(b) are photographs of a mask film manufactured in Example 1 of the present invention after plasma etching. Specifically, FIG. 5(a) is a photograph of the mask film manufactured in Example 1 after the plasma etching, and FIG. 5(b) is a photograph of the quartz base after the mask film is separated. Referring to FIG. 5(a), it was ascertained that in the case of the mask film manufactured in Example 1, there was no thermal deformation of the base caused by the plasma etching, and no adhesive residue remained in the vicinity of the quartz base exposed through the opening. In addition, referring to FIG. 5(b), it was ascertained that after the plasma etching, no residual of the adhesive layer remained on the surface of the quartz base from which the mask film of Example 1 was separated.

FIG. 6 is a photograph of the mask film manufactured in Comparative Example 3 after plasma etching. Referring to FIG. 6, it was ascertained that in the case of the mask film which had the PI base having the thickness of about 25 µm and the adhesive layer having the adhesive force of about 10 gf/in and was manufactured in Comparative Example 3, the base was thermally deformed, which caused wrinkles and bubbles, and an adhesive residue was formed on the surface of the quartz base exposed through the opening.

FIGS. 7(a) and 7(b) are photographs of the mask film manufactured in Comparative Example 5 after plasma etching. Specifically, FIG. 7(a) is a photograph of the mask film manufactured in Comparative Example 5 after the plasma etching, and FIG. 7(b) is a photograph of the quartz base after the mask film is separated. Referring to FIGS. 7(a) and 7(b), it was ascertained that in the case of the mask film which had the adhesive layer having the adhesive force of about 10 gf/in and was manufactured in Comparative Example 5, the adhesive force of the adhesive layer was low and gas penetrated between the adhesive layer and the quartz base, which caused damage to the quartz base, and an adhesive residue was formed at an edge portion of the mask film.

In addition, it was ascertained that in the case of the mask films manufactured in Example 2 of the present invention and Comparative Examples 1, 3, and 4, the mask films were thermally deformed. In particular, it was ascertained that in the case of Comparative Example 2 using the acrylate-based adhesive film, the adhesive layer was degenerated, and many adhesive residues were formed.

Mask Film Test (ICP-RIE Provided with Faraday Cage)

A Faraday cage, which had a mesh part having surface resistance of 0.5605 Ω/sq and a bottom surface formed as a stainless (SUS304) plate, was prepared. Further, the Faraday cage was provided in an induced coupled plasma reactive ion etching (ICP-RIE) device (plasmaLab system 100 manufactured by Oxford Instruments).

Test for Mask Film of Example 1

The mask film of Example 1 was prepared, and an opening was formed in a predetermined region of the mask film. Thereafter, the mask film of Example 1 was attached to a quartz base, and the quartz base was positioned in the Faraday cage, as illustrated in FIG. 2A.

Thereafter, the shutter was positioned on the mesh part so that half of the region of the quartz base was shielded with the shutter. A reactive gas made by mixing $O_2$ and $C_4F_8$ at a ratio of 5:45 was supplied at a flow velocity of 50 sccm, and etching was performed for 7 minutes under a condition in which ICP power was 2 kW, RF power was 150 W, and operating pressure was 7 to 10 mTorr.

It was ascertained that in the case of the mask film manufactured in Example 1, there was no thermal deformation of the base caused by the plasma etching, and no adhesive residue remained in the vicinity of the quartz base exposed through the opening. In addition, it was ascertained that after the plasma etching, no residue of the adhesive layer remained on the surface of the quartz base from which the mask film of Example 1 was separated.

Test for Mask Film of Example 2

The mask film of Example 2 was prepared, and an opening was formed in a predetermined region of the mask film. Thereafter, the mask film of Example 2 was attached to a quartz base, and the quartz base was positioned in the Faraday cage, as illustrated in FIG. 2D.

Thereafter, the shutter was positioned on the mesh part so that half of the region of the quartz base was shielded with the shutter. A reactive gas made by mixing $O_2$ and $C_4F_8$ at a ratio of 5:45 was supplied at a flow velocity of 50 sccm, and etching was performed for 5 minutes under a condition in which ICP power was 2 kW, RF power was 150 W, and operating pressure was 7 to 10 mTorr.

It was ascertained that in the case of the mask film manufactured in Example 2, there was almost no thermal deformation of the base caused by the plasma etching, and no adhesive residue remained in the vicinity of the quartz base exposed through the opening. In addition, it was ascertained that after the plasma etching, no residue of the adhesive layer remained on the surface of the quartz base from which the mask film of Example 2 was separated.

Accordingly, it can be seen that it is possible to easily form the first to fourth pattern portions on the molding base by using the mask film of Example 1 as the second mask film according to the exemplary embodiment of the present invention and by using the mask film of Example 2 as the first mask film according to the exemplary embodiment of the present invention.

EXPLANATION OF REFERENCE NUMERALS AND SYMBOLS

100: Molding base
200, 200': First mask film
300: Second mask film
H1: First opening
H2: Second opening
H3: Third opening
H4: Fourth opening
400: Faraday cage
410: Mesh part
420: Shutter
430: Support
P1: First pattern portion
P2: Second pattern portion
P3: Third pattern portion
P4: Fourth pattern portion
1000: Mold for diffraction grating light guide plate

The invention claimed is:

1. A method of manufacturing a mold for a diffraction grating light guide plate, the method comprising:
   preparing a first mask film including first and second openings each formed in an independent region, respectively;
   attaching the first mask film to one surface of a molding base, opening only the first opening, positioning the molding base with the first mask film attached thereto in a Faraday cage having a mesh part provided on an upper surface thereof, and then forming, by using plasma etching, a first pattern portion in a first region of one surface of the molding base which is exposed through the first opening; and
   opening only the second opening, and then forming, by using plasma etching, a second pattern portion in a second region of one surface of the molding base which is exposed through the second opening,
   wherein the first mask film includes a first base and a first adhesive layer provided on one surface of the first base, a glass transition temperature of the first base is 70° C. or more and 100° C. or less, and adhesive force of the first adhesive layer is 30 gf/in or more and 50 gf/in or less,
   wherein the first mask film further comprises a third opening, and the method further comprises opening only the third opening and then forming, by using plasma etching, a third pattern portion in a third region of one surface of the molding base which is exposed through the third opening.

2. The method of claim 1, wherein the forming of the first pattern portion comprises positioning the molding base with one surface thereof inclined with respect to a bottom surface of the Faraday cage and performing plasma etching to form an inclined pattern portion.

3. The method of claim 1, wherein the forming of the third pattern portion comprises positioning the molding base with one surface thereof in parallel with a bottom surface of the Faraday cage and performing the plasma etching.

4. The method of claim 1, wherein a thickness of the first base is 30 µm or more and 50 µm or less, and a thickness of the first adhesive layer is 5 µm or more and 20 µm or less.

5. The method of claim 1, wherein the mesh part has surface resistance of 0.5 Ω/sq or more.

6. A method of manufacturing a diffraction grating light guide plate, the method comprising:
   preparing a mold for a diffraction grating light guide plate manufactured by the method according to claim 1;
   applying a resin composition onto one surface of the mold for a diffraction grating light guide plate, the surface having pattern portions thereon; and
   curing the resin composition.

7. The method of claim 1, wherein the forming of the second pattern portion comprises positioning the molding base with one surface thereof inclined with respect to a bottom surface of the Faraday cage, shielding at least a part of the mesh part by using a shutter, and then performing plasma etching to form an inclined pattern portion having a depth gradient.

8. The method of claim 7, wherein the shutter shields 20% or more and 80% or less of the mesh part.

9. The method of claim 1, further comprising:
   preparing a second mask film having a fourth opening formed in one region thereof;
   removing the first mask film from one surface of the molding base; and
   attaching the second mask film to one surface of the molding base and forming, by using plasma etching, a fourth pattern portion in a fourth region of one surface of the molding base which is exposed through the fourth opening.

10. The method of claim 9, wherein the forming of the fourth pattern portion comprises positioning the molding base with one surface thereof in parallel with a bottom surface of the Faraday cage, shielding at least a part of the mesh part by using a shutter, and then performing plasma etching to form a pattern portion having a depth gradient.

11. The method of claim 9, wherein the second mask film comprises a second base and a second adhesive layer provided on one surface of the second base, a glass transition temperature of the second base is 230° C. or more and 350°

C. or less, and adhesive force of the second adhesive layer is 30 gf/in or more and 80 gf/in or less.

12. The method of claim 11, wherein a thickness of the second base is 30 μm or more and 70 μm or less, and a thickness of the second adhesive layer is 5 μm or more and 20 μm or less.

* * * * *